United States Patent [19]

Szczyrbowski et al.

[11] Patent Number: 5,082,546
[45] Date of Patent: Jan. 21, 1992

[54] APPARATUS FOR THE REACTIVE COATING OF A SUBSTRATE

[75] Inventors: Joachim Szczyrbowski, Goldbach; Stephan Roegels, Rodenbach, both of Fed. Rep. of Germany

[73] Assignee: Leybold Aktiengesellschaft, Hanua I, Fed. Rep. of Germany

[21] Appl. No.: 660,477

[22] Filed: Feb. 25, 1991

[30] Foreign Application Priority Data

Dec. 31, 1990 [DE] Fed. Rep. of Germany ....... 4042287

[51] Int. Cl.$^5$ ............................................. C23C 14/34
[52] U.S. Cl. ............................ 204/298.08; 204/298.14; 204/192.12
[58] Field of Search .............. 204/192.12, 298.06, 204/298.08, 298.14, 298.16, 298.19

[56] References Cited

U.S. PATENT DOCUMENTS

| | | | |
|---|---|---|---|
| 3,704,219 | 11/1972 | McDowell | 204/298.08 X |
| 3,767,551 | 10/1973 | Lang, Jr. et al. | 204/298.08 |
| 3,887,451 | 6/1975 | Cuomo et al. | 204/298.08 X |
| 4,021,277 | 5/1977 | Shirn et al. | 204/298.08 X |
| 4,131,533 | 12/1978 | Bialko et al. | 204/298.14 |
| 4,395,323 | 7/1983 | Denton et al. | 204/298 A X |
| 4,931,169 | 6/1990 | Scherer et al. | 204/192.12 X |

*Primary Examiner*—Nam X. Nguyen
*Attorney, Agent, or Firm*—Felfe & Lynch

[57] ABSTRACT

An apparatus for reactively coating a substrate 1 with an electrically insulative material comprising an ac power supply connected to the cathodes 5, 5a which are disposed in an evacuable coating chamber 15, 15a. These cathodes interact electrically with the targets 3, 3a, and 3b, 3c to be to be sputtered. The apparatus has three electrodes 6, 5, 5a which are electrically separate from one another and from the sputtering chamber 26. Two electrodes are configured as magnetron cathodes 5, 5a wherein one of the cathode bases 11, 11a and the material of the targets 3, 3a, and 3b, 3c are electrically separate, and the third electrode functions as an anode 6 during the plasma discharge. For this purpose, a power supply source 10 for alternating current is connected to each of the two cathodes 5, 5a which, during a period of alternating current, function as a negative electrode and as a positive electrode. The power supply source 10 has a floating output with three terminals 12, 13, 14. The central tap 14 is connected to the negative pole of a DC power supply 21, the positive pole of which is electrically connected to anode 6. A low-induction, HF-suitable capacitor 16 is inserted between anode 6 and grounded vacuum chamber 26. Another low-induction, HF-suitable capacitor 17 and 18, respectively, is provided for each of the two cathodes between targets 3, 3a and 3b, 3c and their surroundings, and a fourth low-induction, HF-suitable capacitor 27 is between center tap 14 and anode 6, and a fifth capacitor 24 is inserted in the connecting line 23 between the two terminals 12, 13 and the connecting lines 8, 9 for the targets 3, 3a and 3b, 3c.

1 Claim, 1 Drawing Sheet

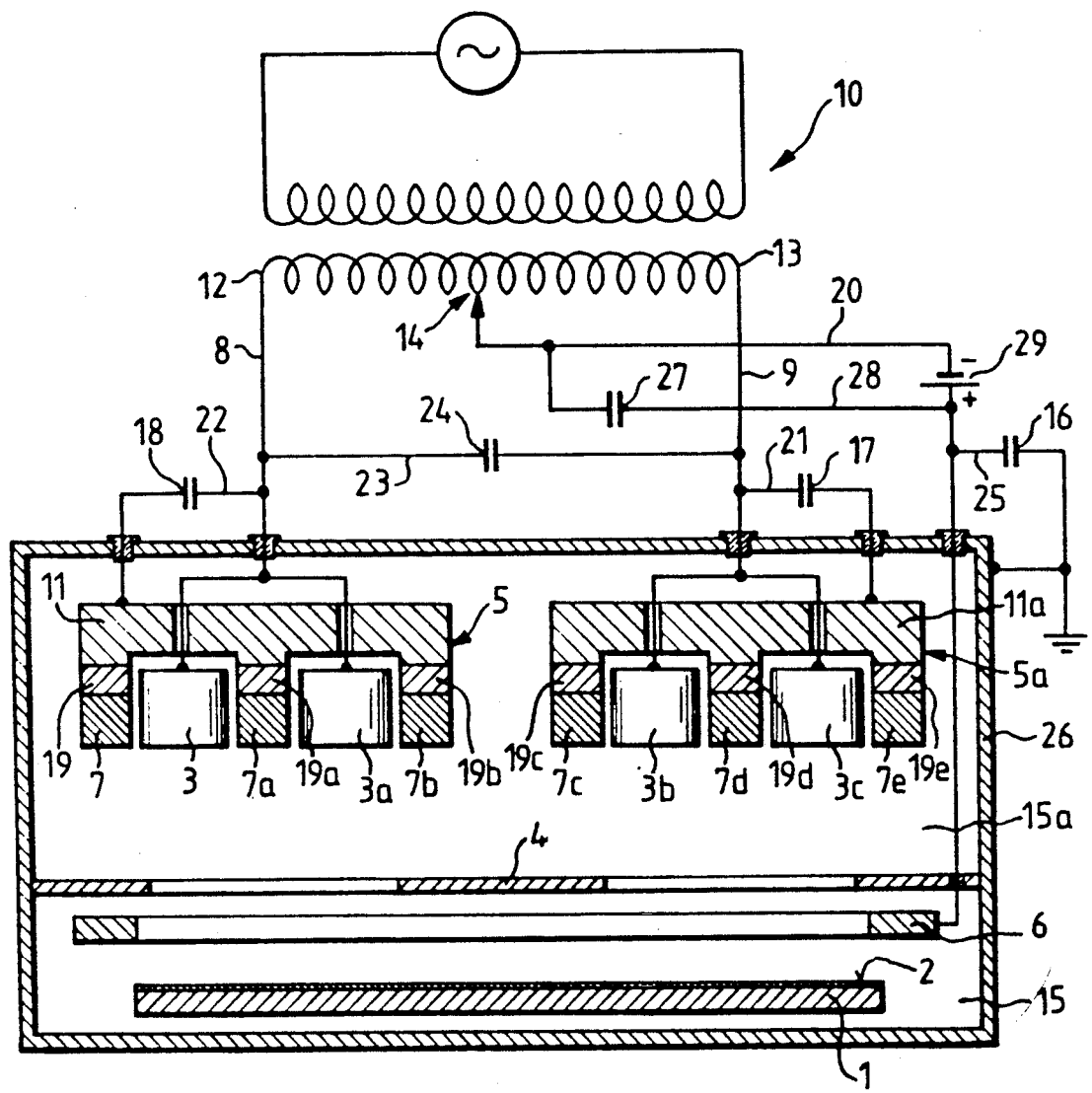

APPARATUS FOR THE REACTIVE COATING OF A SUBSTRATE

BACKGROUND OF THE INVENTION

The invention concerns an apparatus for reactively coating a substrate with an electrically insulative material, silicon dioxide ($SiO_2$) for example. It comprises a power source for alternating current which is connected to an electrode disposed in an evacuable coating chamber. This electrode is electrically connected to a target which is sputtered. The sputtered particles are deposited on the substrate while a process gas and a reactive gas are supplied to the coating chamber.

In known processes for coating substrates by means of cathode sputtering where materials with a high affinity for the reactive gas are used, the problem arises that not only the substrate but also parts of the apparatus like the inner wall of the process chamber or parts of diaphragms are coated with materials of no or poor electrical conductivity. This requires a frequent change of process parameters, particularly electrical arcings, during one single coating procedure or even a frequent interruption of the process and even a frequent cleaning or replacement of parts of the apparatus.

SUMMARY OF THE INVENTION

The present invention provides an apparatus for sputtering materials with a high affinity for the reactive gas. The apparatus should provide a process that is stable and free of arcings and render a cleaning of parts superfluous. Conventional and presently existing apparatus, however, should also be suitable for this purpose without requiring essential or expensive modifications and changes. Moreover, the apparatus should operate trouble-free especially over longer periods even when insulating layers like $SiO_2$, $Al_2O_3$, $NiSi_2$-oxide, $ZrO_2$, $TiO_2$, ZnO are reactively deposited.

This object is accomplished in the invention by three electrodes which are electrically insulated from one another and from the sputtering chamber. Two electrodes are configured as magnetron cathodes where the cathode base and the material of the target are connected to one another in an electrically insulated manner. The third electrode functions as an additional anode during the plasma discharge. A power source for alternating current is provided and during period of alternating current each of the two cathodes connected to this power supply acts as a negative electrode and as a positive electrode so that a plasma discharge during the sputtering process occurs mainly between the two cathodes. For this purpose, the power supply has a floating output with three terminals which are formed, for example, by the two ends of a secondary transformer winding with center tapping. The center tapping is connected to the negative pole of a DC power supply. The voltage thereof corresponds approximately to the effective voltage of the AC power supply, and the positive pole thereof is connected to an anode which is electrically insulated from the vacuum chamber and is disposed in the sputtering chamber. Between the anode and the grounded vacuum chamber, there is low-induction, HF-suitable capacitor and for each of the cathodes, an another low-induction, HF-suitable capacitor is connected between the targets and their surroundings and between the center tapping and the anode, there is also a low-induction, HF-suitable capacitor.

BRIEF DESCRIPTION OF THE DRAWING

The sole FIGURE is a diagrammatic section through a sputtering apparatus with magnetron sputtering cathodes.

DETAILED DESCRIPTION OF THE PREFERRED EMBODIMENT

The drawing shows a substrate 1 which is to be coated with a thin oxide layer 2 (silicon dioxide or aluminum oxide). The targets 3, 3a, and 3b, 3c to be sputtered are located opposite this substrate 1. The magnetron cathode 5 associated with target 3, 3a includes pole shoes 7, 7a, 7b connected to cathode base or magnet yoke 11 via magnets 19, 19a and 19b. Magnetron cathode 5a associated with target 3b, 3c includes pole shoes 7c, 7d, and 7e connected to cathode base or magnet yoke 11a via magnets 19c, 19d, and 19e.

The polarities of the poles of the six magnets focussed onto the targets 3, 3a and 3b, 3c alternate so that the south pole of each of the two outer magnets 19, 19b and 19c, 19e together with the north pole of the corresponding inner magnet 19a, and 19d form magnetic fields of an approximate circular arc shape over targets 3, 3a, 3b, 3c. These magnetic fields condense the plasma in front of the target so that it reaches its greatest density at a point where the magnetic fields reach the maximum of their circular arcs. The ions in the plasma are accelerated by the electric fields generated by the alternating current. The latter is supplied by the power supplies 10, 21.

This AC power supply 10 has three terminals 12, 13, 14 of which only the two outer terminals 12, 13, which are formed by the ends of a secondary transformer winding, are connected to the two cathodes 5, 5a. A line 20 connects the center tap 14 of the secondary transformer winding to the negative pole of the DC power supply 21. The value of the direct voltage corresponds approximately to the effective voltage of the AC power supply 10 or is higher. The two current conductors 8, 9 connect the secondary transformer windings to the two targets 3, 3a and 3b, 3c or to the magnet yokes 11, 11a via additional branch lines 21, 22 with capacitors 17, 18 being interposed therein. A line 23 with a capacitor 24 inserted connects these two conductors to each other. A line 28 with a capacitor 27 inserted in it, connects the third terminal 14 to the positive pole of the DC power supply 29. The power supply 9, in turn, is connected to anode 6 and, via branch line 25, to vacuum chamber 26 and to ground. A capacitor 16 is inserted in this branch line.

The features of the invention which are of particular relevance can hence be summarized as follows:

a. Instead of one single cathode, the sputtering chamber 15a accommodates two electrically insulated cathodes 5, 5a both of which are connected to an AC-power supply source 10. During a period of the alternating current, each of the two cathodes 5, 5a functions as a negative electrode and as a positive electrode, i.e. the plasma discharge of the sputtering process occurs between the two cathodes 5, 5a.

b. The AC-power supply 10 to which both cathodes 5, 5a are connected has an electrically floating output with three terminals 12, 13, 14. One of the two outer terminals 12, 13 is connected to one of the cathodes 5, 5a and the other one to the second cathode. All are electrically symmetric with respect to the third terminal 14 (e.g. two ends of a secondary transformer winding with one protruding center of the secondary winding).

c. The third terminal 14 of the AC power supply 10 (e.g. the center of the transformer winding) is connected the negative pole of a DC-power supply 29 with a (floating) output. The value of the DC current voltage corresponds approximately to the effective voltage of the AC-power supply or is higher.

d. The second terminal of the DC power supply 29 is connected to an anode 6 in the sputtering chamber 15. This anode 6 is incorporated so as to be electrically insulated from vacuum chamber 26.

e. A low-induction, HF-suitable capacitor 24 is inserted between the two cathodes 5, 5a.

f. Another low-induction capacitor 16 is inserted between anode 6 of the DC-power supply 29 and the grounded vacuum chamber 26.

g. For each of the two cathodes 5, 5a, there is a low-induction, HF-suitable capacitor 17, 18 inserted between targets 3, 3a and 3b, 3c.

h. A low-induction, HF-suitable capacitor 27 is inserted (in line 24) between the center terminal 14 of the AC power supply (center of transformer to which the negative pole of the DC power supply 29 is also connected) and anode 6.

It is the task of the DC power supply 29 to maintain the AC power supply 10 on a high negative value. This prevents the maximum positive voltage of cathode 5, 5a from being too high with respect to ground (sputtering chamber 26) or cathode surroundings. An excessively high positive cathode voltage leads to an unstable behavior of the sputtering process (e.g. plasma ignitions in the vicinity of the cathode), to flash-overs and arcings of the cathodes. The current passing the DC-power supply must be much smaller than the actual sputtering current of the AC power supply 10.

It is the task of the capacitor 24 to short-circuit the high frequency voltage oscillations and current oscillations which are induced by the sputtering plasma and lead to flash-overs and arcings.

Capacitor 16 is of particular importance when, during the reactive coating, an electrically insulating layer is produced which also grows on the anode 6. It is the task of this capacitor 16 to enable reignition of the plasma after the shut-down of the power supply.

It is the task of capacitor 17, 18 to eliminate the occurrence of random electric flash-overs which are generated between target 3, 3a and 3b, 3d and the target surroundings.

The task of capacitor 27 is identical to the one of capacitor 24. In this case, however, it applies to the electric circuit of the DC power supply unit 29.

We claim:

1. Apparatus for electrically coating a substrate with an electrically insulative material, comprising
   an AC power supply having a floating output and comprising a transformer with a secondary winding having a first end terminal, a second end terminal, and a third terminal tapped therebetween,
   a DC power supply having a positive pole, a negative pole, and a voltage which corresponds approximately to the effective voltage of the AC power supply, said negative pole being connected to said third terminal,
   an evacuable coating chamber,
   a first target of electrically conductive material connected to said first terminal via a first connecting line,
   a first magnetron cathode electrically insulated from said first target but arranged to attract electrically charged particles toward said first target and electrically connected to said first terminal via a first capacitor,
   a second target of electrically conductive material connected to said second terminal via a second connecting line,
   a second magnetron cathode electrically insulated from said second target but arranged to attract electrically charged particles toward said second target and electrically connected to said second terminal via a second capacitor,
   an anode in said coating chamber and electrically insulated therefrom, said anode being directly connected to said positive pole of said DC power supply,
   means connecting said anode to ground via a third capacitor,
   means connecting said anode to said third terminal via a fourth capacitor, and
   means connecting said first connecting line to said second connecting line via a fifth capacitor.

* * * * *